(12) United States Patent
Park et al.

(10) Patent No.: US 7,727,354 B2
(45) Date of Patent: Jun. 1, 2010

(54) STRUCTURE FOR PREVENTING GAP FORMATION AND PLASMA PROCESSING EQUIPMENT HAVING THE SAME

(75) Inventors: Eui-Jin Park, Hwaseong-si (KR); Yun-Ho Choi, Yongin-si (KR); In-Young Park, Hwaseong-si (KR); Hwan-Il Jeong, Hwaseong-si (KR); Sung-Sok Choi, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 116 days.

(21) Appl. No.: 11/971,568

(22) Filed: Jan. 9, 2008

(65) Prior Publication Data
US 2009/0044751 A1 Feb. 19, 2009

(30) Foreign Application Priority Data
Jan. 10, 2007 (KR) ............... 10-2007-0002959

(51) Int. Cl.
C23F 1/00 (2006.01)
H01L 21/306 (2006.01)
C23C 16/00 (2006.01)
(52) U.S. Cl. ............... 156/345.43; 118/723 E
(58) Field of Classification Search ........... 118/715, 118/728; 156/345.1, 345.11, 345.12, 345.14, 156/345.51
See application file for complete search history.

(56) References Cited

U.S. PATENT DOCUMENTS

| | | | | |
|---|---|---|---|---|
| 6,074,488 A | * | 6/2000 | Roderick et al. | 118/728 |
| 6,554,954 B2 | * | 4/2003 | Ma et al. | 156/345.51 |
| 6,723,202 B2 | * | 4/2004 | Nagaiwa et al. | 156/345.43 |
| 2004/0129226 A1 | * | 7/2004 | Strang et al. | 118/728 |

FOREIGN PATENT DOCUMENTS

| | | |
|---|---|---|
| JP | 2002-033376 | 1/2002 |
| JP | 2003-152063 | 5/2003 |
| KR | 20-2000-0011778 | 7/2005 |
| KR | 1020050091854 A | 9/2005 |
| KR | 1020060005740 A | 1/2006 |
| KR | 1020060029359 A | 4/2006 |
| KR | 10-2007-0008980 A | 1/2007 |

OTHER PUBLICATIONS

Decision of Grant dated Jun. 23, 2008 in corresponding Korean Patent Application No. 10-2007-0002959.

* cited by examiner

Primary Examiner—Parviz Hassanzadeh
Assistant Examiner—Maureen Gramaglia
(74) Attorney, Agent, or Firm—F. Chau & Associates, LLC

(57) ABSTRACT

Plasma processing equipment having a structure for preventing gap formation includes: a chamber inside which a plasma environment is formed; an upper electrode positioned at a upper position of the chamber; an electrostatic chuck positioned at a lower position of the electrostatic chuck, having a lower electrode and holding a wafer on a top surface thereof; a ring positioned at an outer side of the electrostatic chuck; and a gap prevention unit for isolating from the outside a space between the electrostatic chuck and the ring.

12 Claims, 8 Drawing Sheets

STRUCTURE FOR PREVENTING GAP FORMATION AND PLASMA PROCESSING EQUIPMENT HAVING THE SAME

CROSS-REFERENCE TO RELATED APPLICATION

This application claims priority from Korean Patent Application No. 2007-0002959, filed Jan. 10, 2007, the disclosure of which is hereby incorporated herein by reference in its entirety as if set forth fully herein.

BACKGROUND OF INVENTION

1. Technical Field

The present disclosure relates to plasma processing equipment and, more particularly, to a structure for preventing gap formation, which prevents plasma deposition in the space between a chuck and a ring, and plasma processing equipment having the same.

2. Discussion of Related Art

Generally, a semiconductor device is fabricated by selectively and repeatedly performing certain fabrication processes, such as photolithography, etching, ashing, diffusion, chemical vapor deposition, ion implantation, metal deposition, and the like, on a wafer.

Among the aforementioned semiconductor device fabrication processes, an etching process is divided into a wet etching process and a dry etching process.

The dry etching process etches a layer material formed on a wafer, by supplying a reactive gas into a chamber to form plasma in the chamber, and using a chemical and physical reaction of reactive ions to perform the etching.

FIG. 1 is a sectional view of conventional plasma processing equipment used for a dry etching process.

In FIG. 1, the conventional plasma processing equipment comprises: a chamber, an electrostatic chuck, an upper electrode, and a gas supply unit. The electrostatic chuck is positioned inside the chamber, holds a wafer on which a layer material is formed, and has a lower electrode. The upper electrode is positioned in the chamber to be above the electrostatic chuck. The gas supply unit supplies a reactive gas into the chamber.

Therefore, when the reactive gas is supplied from the gas supply unit into the chamber and RF power is applied from an external power source to the upper and lower electrodes, a plasma environment is formed inside the chamber.

Specifically, the conventional plasma processing equipment includes a focus ring at an outer side of the electrostatic chuck. The focus ring is composed of a silicon material and surrounds the outer side of the electrostatic chuck. Therefore, the focus ring allows a plasma generation region to be uniformly formed on the wafer held on the electrostatic chuck.

A number of rings are positioned around the focus ring. This constitution will be described in more detail hereinbelow.

As illustrated in FIG. 1, the electrostatic chuck 20 has a stepped part around its outside circumference. The focus ring 30 is positioned on the stepped part. A number of other rings are positioned at an outer side of the focus ring 30. These other rings are positioned at the outside circumference of the electrostatic chuck 20 and include a holder ring 50 positioned under the focus ring 30, an outer ring positioned at an outer side of the holder ring 50, and a cover ring positioned on the outer ring and covering the outer side of the focus ring.

A gap is formed in the spaces between the outer circumference surfaces of the holder ring 50 and the focus ring 30 and between the rings, thereby forming channels, as represented by the arrows shown in FIG. 1. A gap is present that is an exhaust channel through which the gas is exhausted after the process is performed inside the chamber.

Among the conventional plasma processing equipment, the Me_SCCM equipment of TEL includes a rubber element 31 composed of the silicon (Si) material. The rubber element 31 is interposed between the electrostatic chuck 20 and the focus ring 30 to improve thermal conductivity of the focus ring 30.

The rubber element 31 is interposed between the bottom surface of the focus ring 30 and the stepped part of the electrostatic chuck 20, as illustrated in FIG. 1.

An operation of the conventional plasma processing equipment in the aforementioned constitution will be described below.

Referring to FIG. 1, an external power supply (not shown) applies the RF power to the upper and lower electrodes (not shown). The gas supply unit supplies the reactive gas into the chamber. Therefore, the reactive gas supplied into the chamber is formed as plasma inside the chamber by the RF power. Reaction ions of the plasma are attracted towards the wafer W by the self bias electric potential of the wafer, and the attracted reaction ions etch the layer material formed on the wafer W.

Then, the reaction ions etch an inner circumference surface of the focus ring 30 and an outer circumference surface of the electrostatic chuck 20 that are in contact with each other, to form a gap B between the inner circumference surface of the focus ring 30 and the outer circumference surface of the electrostatic chuck 20. Therefore, in the conventional plasma processing equipment, because the reaction ions introduced through the gap B flow along the channel following the arrow directions shown in FIG. 1, the rubber element 31 positioned at the stepped part of the electrostatic chuck 20 becomes burned.

Moreover, after etching, the reaction ions pass through the channel along the direction of the arrows, to be exhausted outside the chamber. Then, in the conventional plasma processing equipment, after the reaction at high temperatures, the reaction ions burn the rubber element 31, as indicated above.

Furthermore, in the conventional plasma processing equipment, polymers or other byproducts, which are generated when the layer material formed on the wafer W is etched by the reaction ions, accumulate or flow into the inside of the channel along the direction of the arrows shown in FIG. 1.

SUMMARY OF THE INVENTION

Therefore, exemplary embodiments of the present invention are directed to provide a structure to prevent gap formation, which thus prevents burning of a sealing member interposed between an electrostatic chuck and a focus ring, and plasma processing equipment having the same structure.

An exemplary embodiment of the present invention provides a structure to prevent gap formation, which thus prevents polymers or other byproducts from accumulating in the space formed between an electrostatic chuck and a focus ring after an etching process, and plasma processing equipment having the same.

In an exemplary embodiment of the present invention, there is provided a structure for preventing gap formation. The structure for preventing gap formation comprises a chuck, a ring positioned at an outer side of the chuck; and a gap prevention unit for isolating a space between the chuck and the ring from the outside.

The chuck may have a stepped part formed at an outside circumference of the chuck and including a first stepped surface and a second stepped surface; the ring may be positioned at the stepped part; and the space between the chuck and the ring may have a first space, which is formed between an inner circumference surface of the ring and the first stepped surface, and a second space, which is formed between a bottom surface of the ring and the second stepped surface.

The gap prevention unit may comprise: a first extension part that is extended from the ring, at a predetermined length, to be secured against a first outer surface of the chuck and to seal the first space from the outside; and a second extension part that is extended from the ring, at a predetermined length, to be secured against a second outer surface of the chuck and to seal the second space from the outside.

The first outer surface of the chuck may be a first connection groove that is fitted with and connected to the first extension part; and the second outer surface of the chuck may be a second connection groove that is fitted with and connected to the second extension part.

The gap prevention unit may comprise: a first extension part that is extended from the chuck, at a predetermined length, to be secured against a first outer surface of the ring and to seal the first space from the outside; and a second extension part that is extended from the chuck, at a predetermined length, to be secured against a second outer surface of the ring and to seal the second space from the outside.

The first outer surface of the ring may be a first connection groove that is fitted with and connected to the first extension part; and the second outer surface of the ring may be a second connection groove that is fitted with and connected to the second extension part.

A sealing member may be interposed in the space between the chuck and the ring.

The sealing member may be positioned to be fitted into a first groove formed on each of the inner circumference surface and the bottom surface of the ring.

The sealing member may be positioned to be fitted into a second groove formed in each of the first stepped surface and the second stepped surface of the chuck.

In an exemplary embodiment of the present invention, there is provided plasma processing equipment having a structure for preventing gap formation.

The plasma processing equipment comprises: a chamber inside which a plasma environment is formed; an upper electrode positioned at a upper position of the chamber; an electrostatic chuck positioned at a lower position of the electrostatic chuck, having a lower electrode and holding a wafer on a top surface thereof; a ring positioned at an outer side of the electrostatic chuck; and a gap prevention unit for isolating a space between the electrostatic chuck and the ring from the outside.

The electrostatic chuck may have a stepped part formed at an outside circumference of the electrostatic chuck and including a first stepped surface and a second stepped surface; the ring may be positioned at the stepped part; and the space between the electrostatic chuck and the ring may have a first space, which is formed between an inner circumference surface of the ring and the first stepped surface, and a second space, which is formed between a bottom surface of the ring and the second stepped surface.

The ring may have its outer side with an outer diameter greater than an outer diameter of the electrostatic chuck, and the ring may be a focus ring positioned at the stepped part.

The outer side of the electrostatic chuck may include a holder ring positioned under the focus ring.

The gap prevention unit may comprise: a first extension part that is extended from the ring, at a predetermined length, to be secured against a first outer surface of the electrostatic chuck and to seal the first space from the outside; and a second extension part that is extended from the ring, at a predetermined length, to be secured against a second outer surface of the electrostatic chuck and to seal the second space from the outside The gap prevention unit may comprise a third extension part that is extended from the bottom surface of the ring, at a predetermined length, to be secured against a top surface of the holder ring and a third surface of the electrostatic chuck and to seal the second space from the outside.

The first outer surface of the electrostatic chuck may be a first connection groove that is fitted with and connected to the first extension part; and the second outer surface of the electrostatic chuck may be a second connection groove that is fitted with and connected to the second extension part.

The gap prevention unit may comprise: a first extension part that is extended from the electrostatic chuck, at a predetermined length, to be secured against a first outer surface of the ring and to seal the first space from the outside; and a second extension part that is extended from the electrostatic chuck, at a predetermined length, to be secured against a second outer surface of the ring and to seal the second space from the outside.

The gap prevention unit may comprise a third extension part that is extended from an upper surface of the holder ring, at a predetermined length, to be secured against the bottom surface of the focus ring and the third surface of the electrostatic chuck and to seal the second space from the outside.

The first outer surface of the ring may be a first connection groove that is fitted with and connected to the first extension part; and the second outer surface of the ring may be a second connection groove that is fitted with and connected to the second extension part.

A sealing member may be interposed in the space between the electrostatic chuck and the ring.

The sealing member may be positioned to be fitted into a first groove formed on each of the inner circumference surface and the bottom surface of the ring.

The sealing member may be positioned to be fitted into a second groove formed in each of the first stepped surface and the second stepped surface of the electrostatic chuck.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

Figure 1:
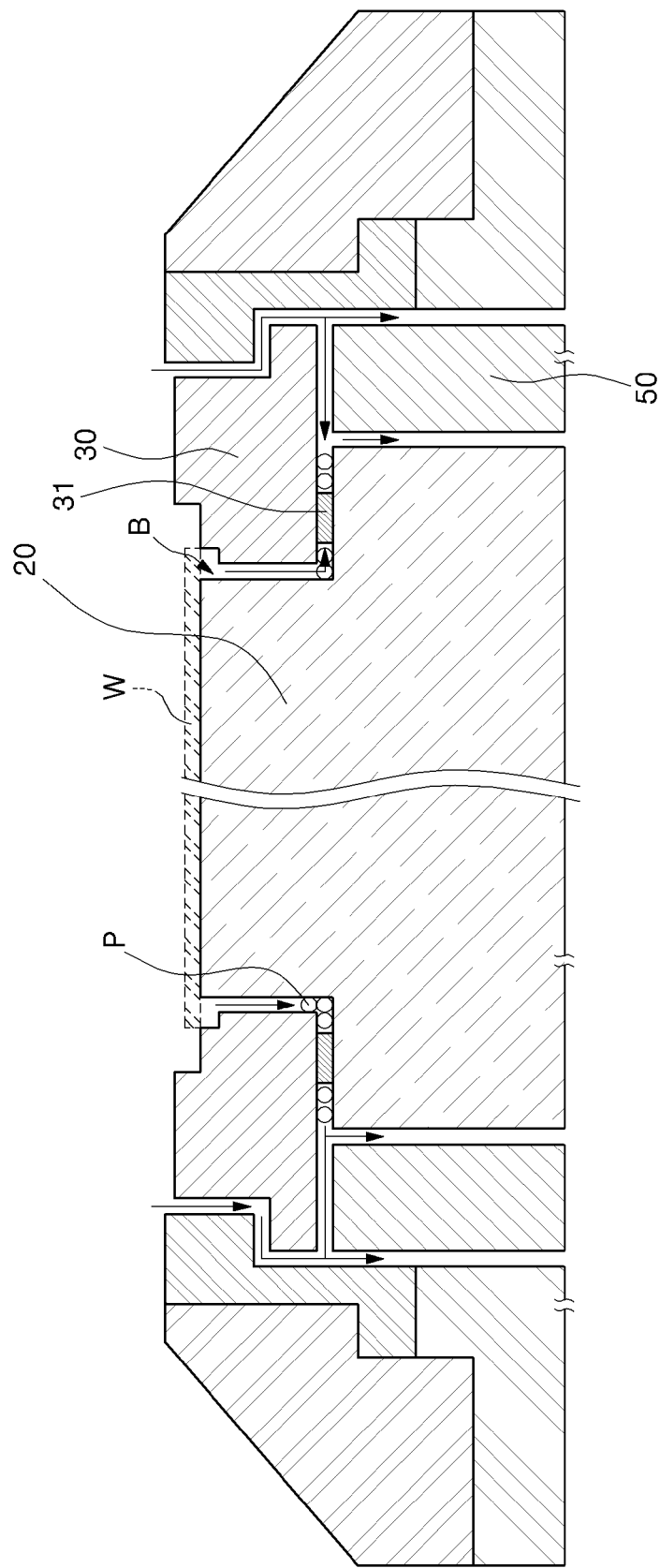
FIG. 1 is a sectional view of conventional plasma processing equipment used for a dry etching process.

The present invention will now be described more fully hereinafter with reference to the accompanying drawings, in which exemplary embodiments of the invention are shown. This invention may, however, be embodied in many different forms and should not be construed as being limited to the exemplary embodiments set forth herein. Rather, these exemplary embodiments are provided so that this disclosure will be thorough and complete, and will fully convey the scope of the invention to those of ordinary skill in the art. In the drawings, like numbers refer to like elements throughout the specification.

Figure 2:
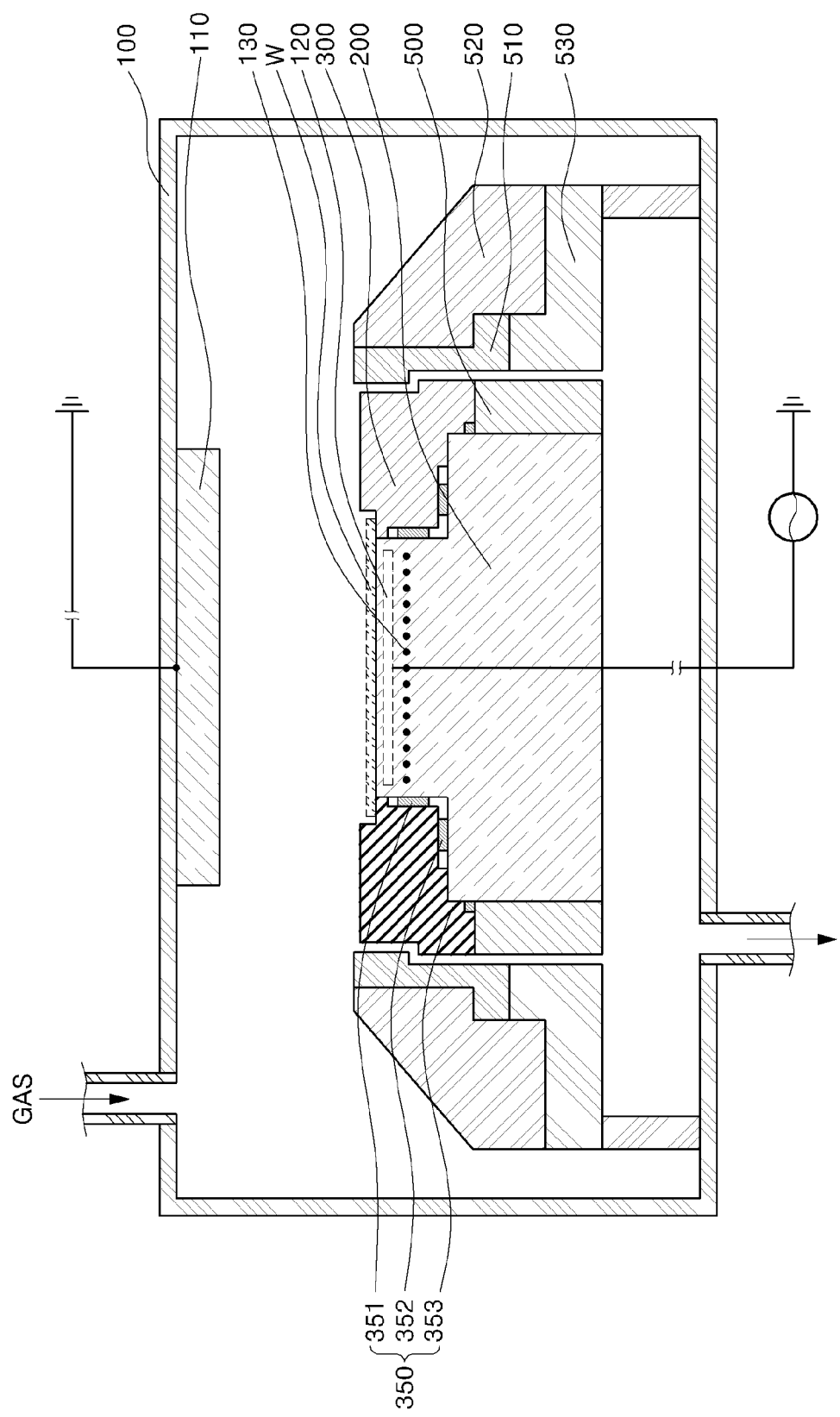
FIG. 2 is a sectional view of plasma processing equipment having a structure for preventing gap formation according to an exemplary embodiment of the present invention.

FIG. 2 is a sectional view of plasma processing equipment having a structure for preventing gap formation according to an exemplary embodiment of the present invention.

In FIG. 2, the plasma processing equipment having the structure for preventing gap formation comprises a chamber 100 inside which a plasma environment is formed. The chamber 100 contains an upper electrode 110 and an electrostatic chuck 200. The upper electrode 110 is positioned at an upper position inside the chamber 100. The electrostatic chuck 200 comprises a lower electrode 120 and a heater 130 that is heated to a predetermined temperature when power is applied from the outside to the lower electrode 120. A wafer W on which a layer material is supplied is held on a top surface of the electrostatic chuck 200.

Figure 3:
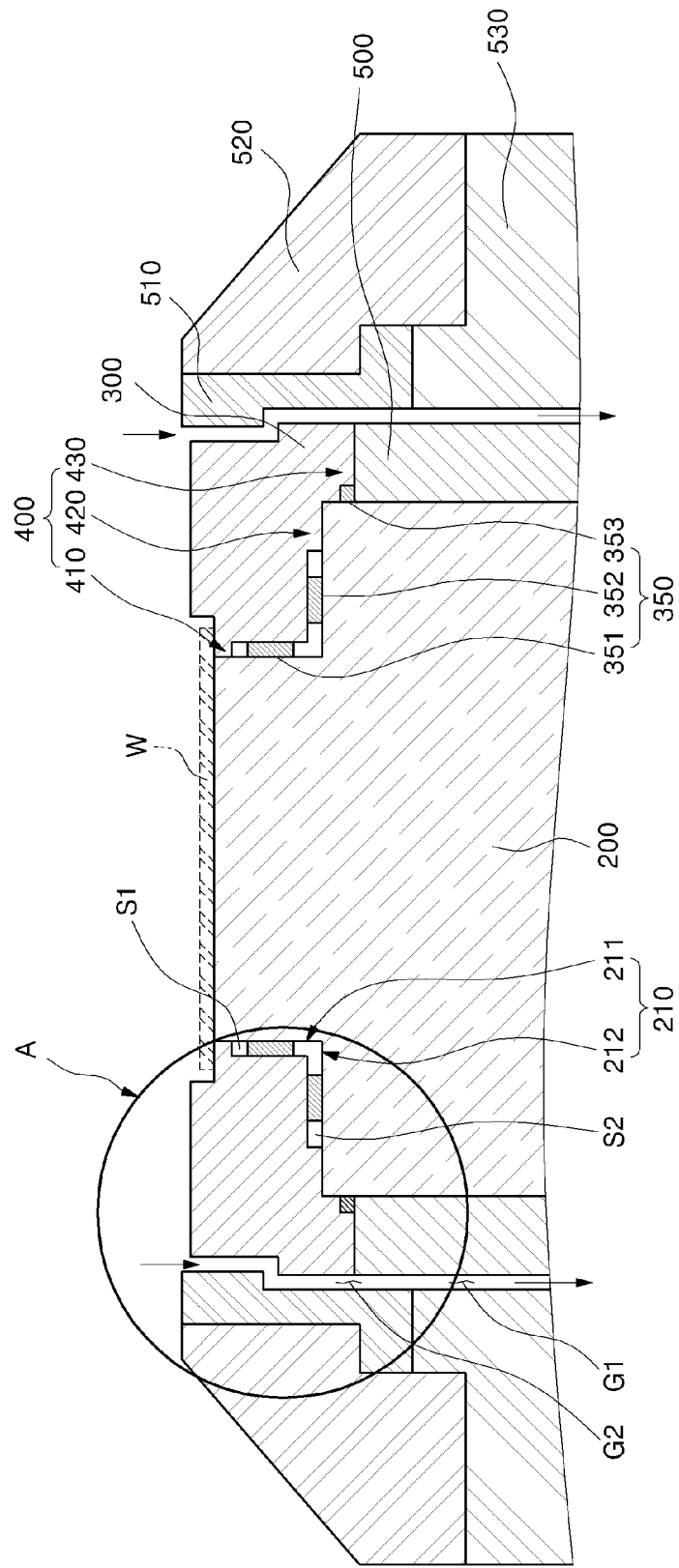
FIG. 3 is a sectional view of a structure for preventing gap formation according to the exemplary embodiment of the present invention shown in FIG. 2.

In FIG. 3, the electrostatic chuck 200 is shown in a larger scale and is seen to comprise a focus ring 300 positioned around an outer side of the electrostatic chuck 200. The focus ring 300 is positioned at a stepped part 210 formed at an outside circumference of the electrostatic chuck 200.

Figure 4:
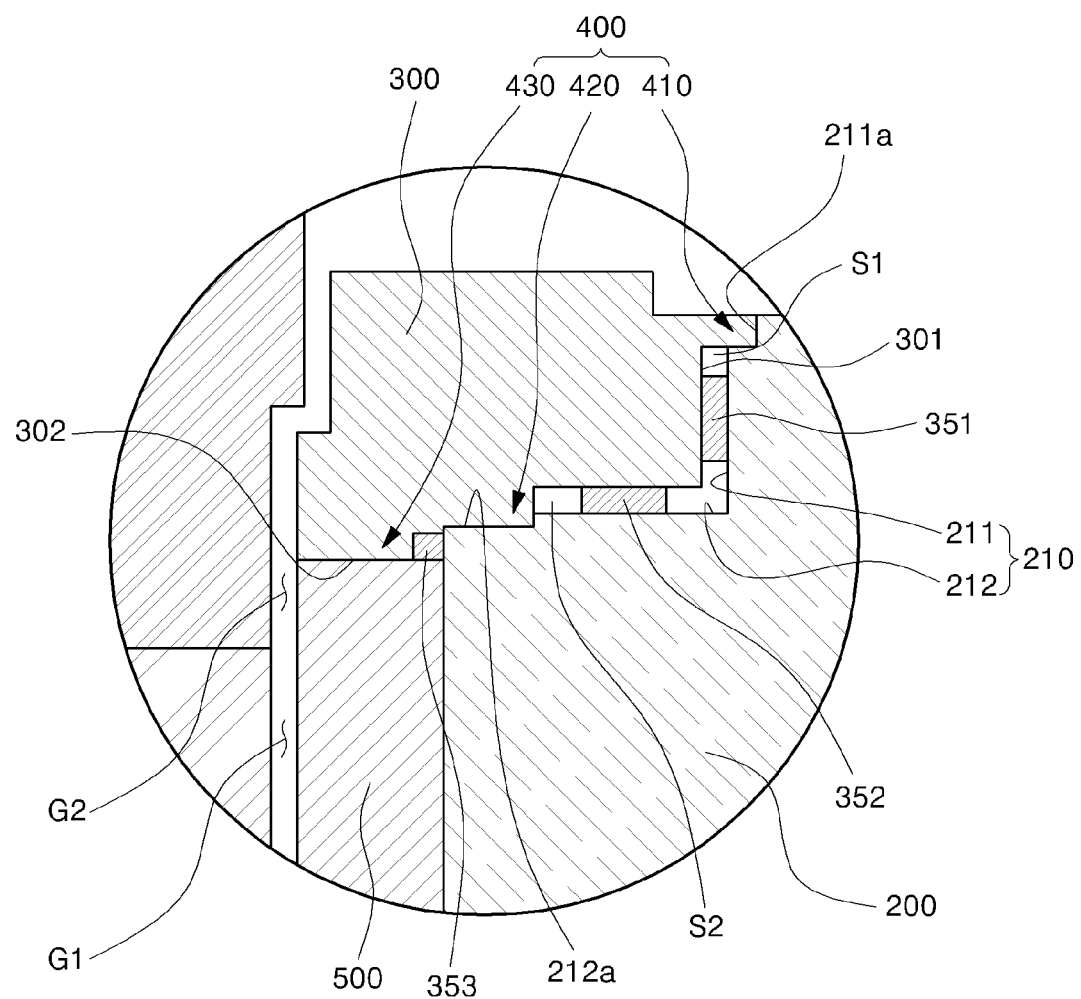
FIG. 4 is an enlargement of Part A of the structure shown in FIG. 3.

In FIG. 4, the stepped part 210 of the electrostatic chuck 200 has a first stepped surface 211 and a second stepped surface 212. The first stepped surface 211 is opposite to an inner circumference surface 301 of the focus ring 300. The second stepped surface 212 is perpendicular to the first stepped surface 211 and is opposite to a bottom surface 302 of the focus ring 300. The first stepped surface 211 and the second stepped surface are perpendicular to each other.

Therefore, the inner circumference surface 301 of the focus ring 300 is positioned to face the first stepped surface 211, and the bottom surface 302 of the focus ring 300 is positioned to face the second stepped surface 212. Then, a first space S1 is formed between the inner circumference surface 301 of the focus ring 300 and the first stepped surface 211 of the electrostatic chuck 200. A second space S2 is formed between the bottom surface 302 of the focus ring 300 and the second stepped surface 212 of the electrostatic chuck 200.

As illustrated in FIG. 3, an outer diameter of the outermost edge of the focus ring 300 is greater than an outer diameter of the outermost edge of the electrostatic chuck 200. Therefore, the outer side of the focus ring 300 protrudes from the outside circumference of the electrostatic chuck 200.

A gap prevention unit 400 according to an exemplary embodiment of the present invention will be described.

In FIG. 3, the gap prevention unit 400 comprises a first extension part 410 and a second extension part 420. The first extension part 410 protrudes from the inner circumference surface 301 of the focus ring 300, at a predetermined length, to be secured against the first stepped surface 211 of the electrostatic chuck 200. The second extension part 420 protrudes from the bottom surface 302 of the focus ring 300, at a predetermined length, to be secured against the second stepped surface 212 of the electrostatic chuck 200. Therefore, the first extension part 410 and the second extension part 420 seal the first space S1 and the second space S2 from the outside.

In FIG. 4, the electrostatic chuck 200 has a first connection groove 211a and a second connection groove 212a. The first extension part 410 is fitted into the first connection groove 211a, and the second extension part 420 is fitted into the second connection groove 212a. The first connection groove 211a is formed at an upper position of the first stepped surface 211 of the electrostatic chuck 200, and the second connection groove 212a is formed on the second stepped surface 212 of the electrostatic chuck 200.

Figure 6:
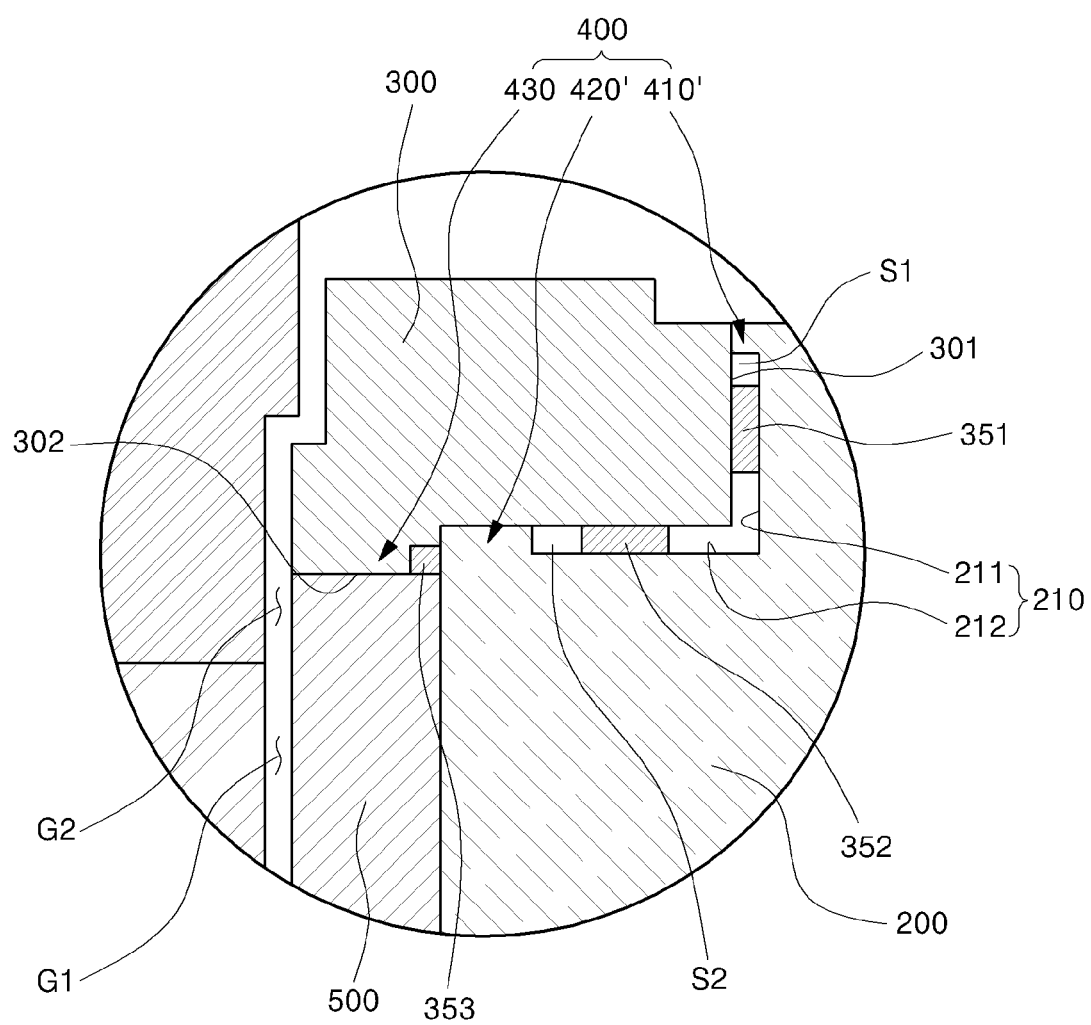
FIG. 6 is a sectional view of a structure for preventing gap formation according to an exemplary embodiment of the present invention.

In FIG. 6, the gap prevention unit 400 may have a first extension part 410' and a second extension part 420'. The first extension part 410' protrudes from the first stepped surface 211 of the electrostatic chuck 200, at a predetermined length, to be secured against the inner circumference surface 301 of the focus ring 300. The second extension part 420' protrudes from the second stepped surface 212 of the electrostatic chuck 200, at a predetermined length, to be secured against the bottom surface 302 of the focus ring 300. Therefore, the first extension part 410' and the second extension part 420' have a structure for sealing the first space S1 and the second space S2 from the outside.

Figure 7:
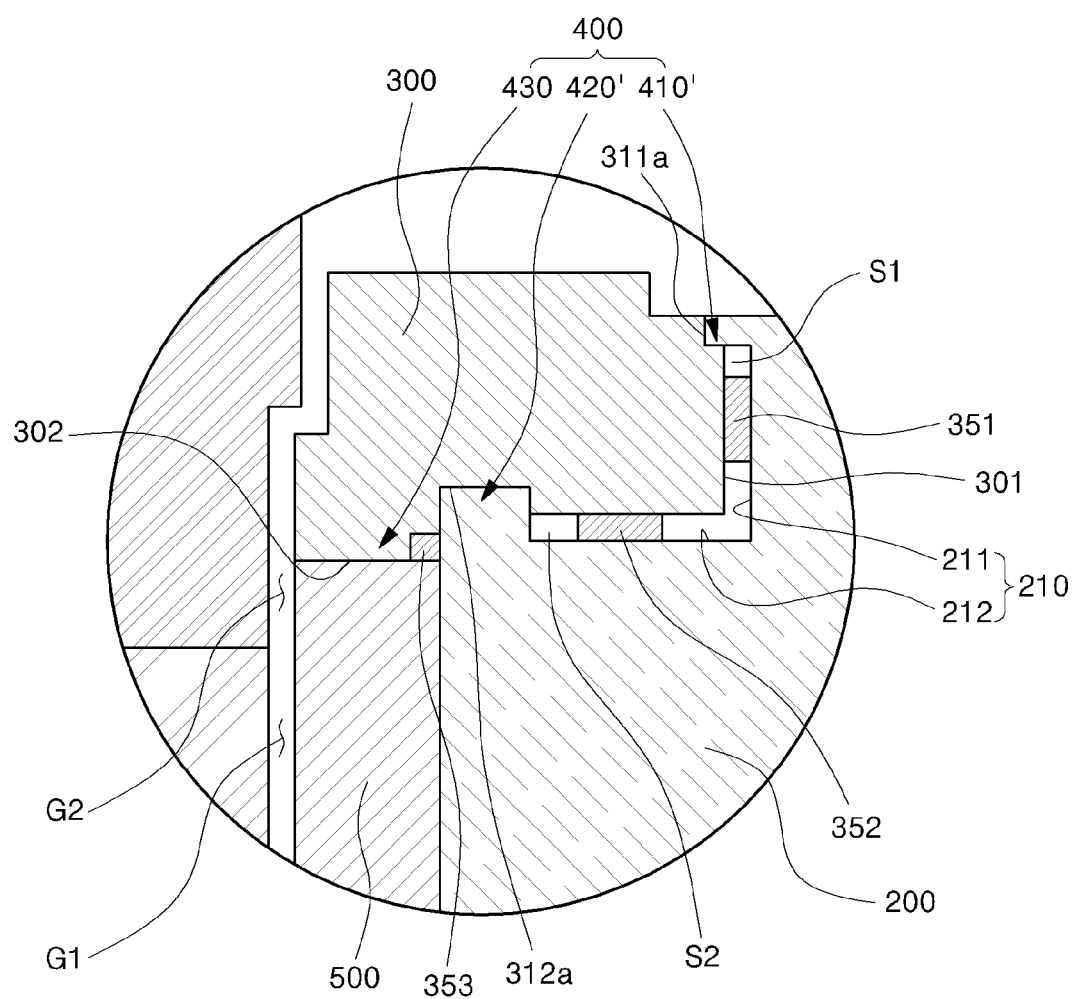
FIG. 7 is a sectional view of a modified exemplary embodiment of the structure for preventing gap formation shown in FIG. 6.

In FIG. 7, the focus ring 300 may have a first connection groove 311a and a second connection groove 312a. The first extension part 410' is fitted into the first connection groove 311a, and the second extension part 420' is fitted into the second connection groove 312a. The first connection groove 311a may be formed at an upper position of the inner circumference surface 301 of the focus ring 300, and the second connection groove 312a may be formed on the bottom surface 302 of the focus ring 300.

Figure 5:
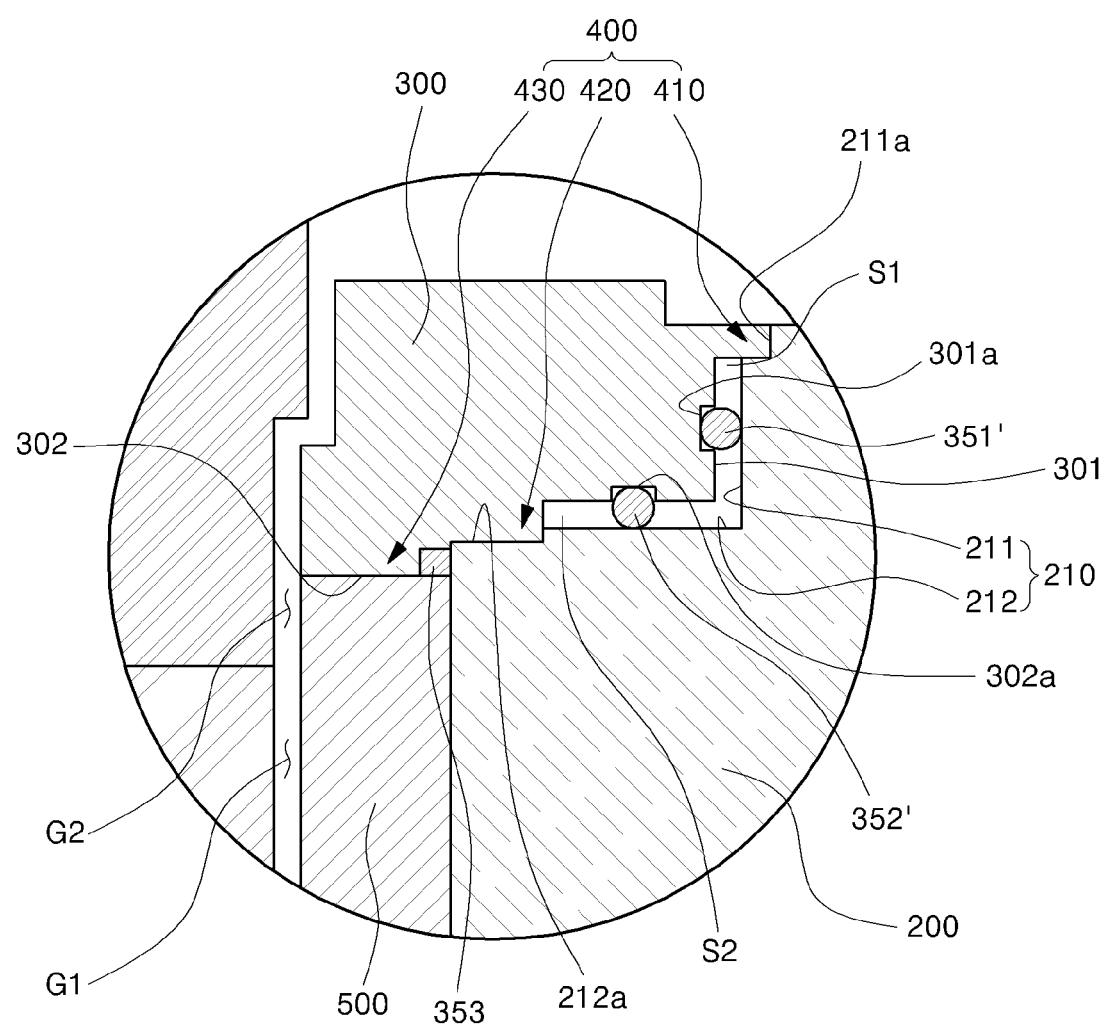
FIG. 5 is a sectional view of a modified exemplary embodiment of the structure for preventing gap formation shown in FIG. 4.
Figure 8:
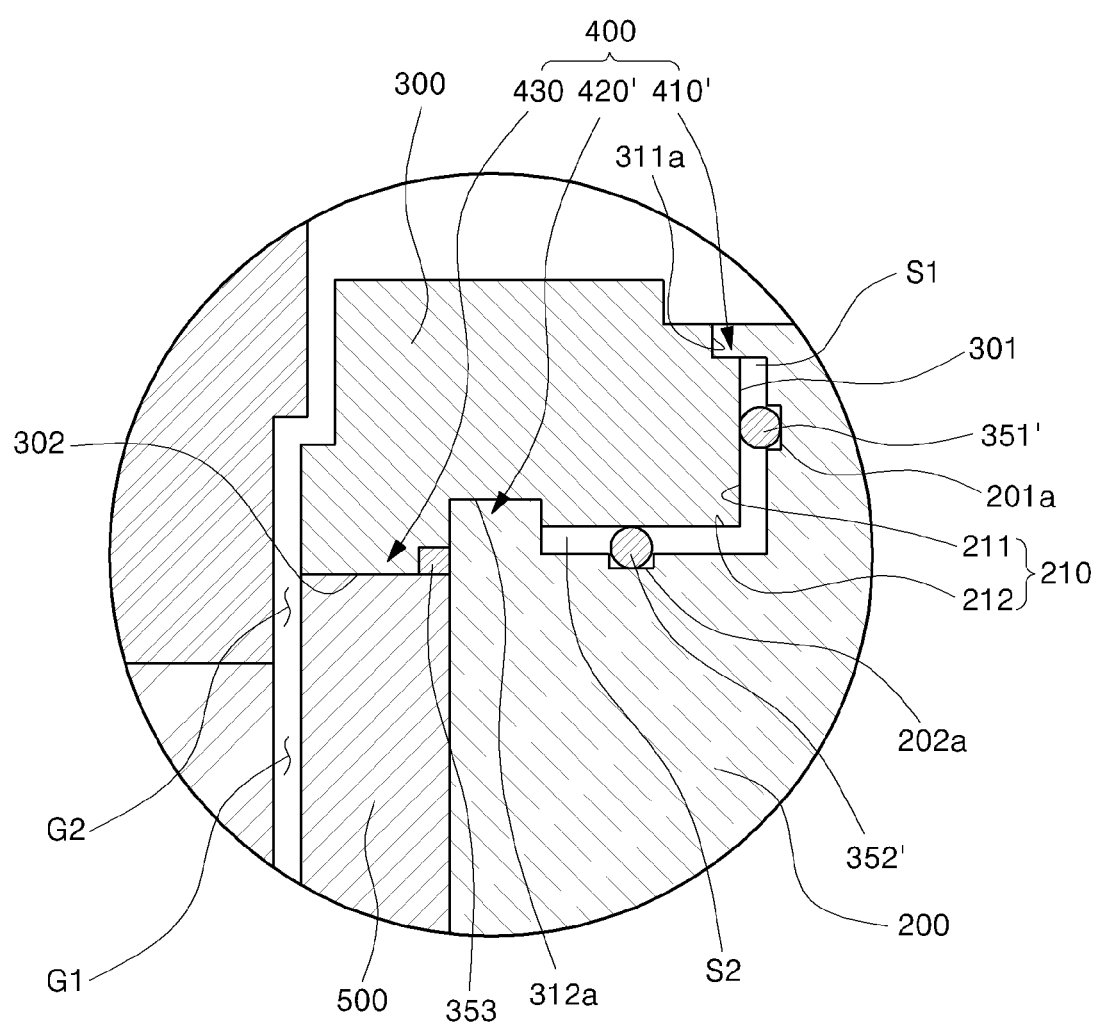
FIG. 8 is a sectional view of an exemplary embodiment of the structure for preventing gap formation shown in FIG. 6.

As illustrated in FIGS. 4 and 7, a first sealing member 351 and a second sealing member 352 may be respectively interposed in the spaces between the focus ring 300 and the electrostatic chuck 200, that is, the first space S1 and the second space S2, respectively. The sealing members may be a first sealing member 351' and a second sealing ember 352' formed as an O-ring type, as illustrated in FIGS. 5 and 8. The sealing members 351, 352, 351' and 352' may be composed of rubber or metal.

In FIG. 5, the focus ring 300 has grooves into which the sealing members 351' and 352' are fitted. The grooves include a first groove 301a and a second groove 302a. The first groove 301a may be formed on the inner circumference surface 301 of the focus ring 300 and receives sealing member 351', and the second groove 302a may be formed on the bottom surface 302 of the focus ring 300 and receives sealing member 352'.

In FIG. 8, the electrostatic chuck 200 has grooves into which the sealing members 351' and 352' are respectively fitted. The grooves include a first groove 201a and a second groove 202a. The first groove 201a may be formed on the first stepped surface 211 of the electrostatic chuck 200 and receives sealing member 351', and the second groove 202a may be formed on the second stepped surface 212 of the electrostatic chuck 200 and receives sealing member element 352'.

A holder ring 500 is positioned under the focus ring 300 as illustrated in FIG. 2. An inner circumference surface of the holder ring 500 can be secured against an outer circumference surface of the electrostatic chuck 200.

As shown in FIGS. 3-8, the focus ring 300 may further comprise a third extension part 430. The third extension part 430 is extended from the bottom surface 302 of the focus ring 300, at a predetermined length, and is secured against the top surface of the holder ring 500. Therefore, the gap prevention unit 400 according to the present invention may further comprise the third extension part 430. The second space S2 can be sealed from the outside because the third extension part 430 and the top surface of the holder ring 500 are secured against each other.

As illustrated in FIG. 3, an outer ring 530 composed of quartz is positioned at an outer side of the holder ring 500. A first gap G1 having a predetermined space may be formed between the inner circumference surface of the outer ring 530 and the outer circumference surface of the holder ring 500.

An inner cover ring 510 is positioned on the outer ring 530, to cover the outer side of the focus ring 300. A second gap G2 having a predetermined space may be formed between the inner circumference surface of the outer ring 530 and the outer circumference surface of the focus ring 300.

The first gap G1 and the second gap G2 may form a channel connected to each other. The channel may be exposed outside the focus ring 300, that is, in the inner space of the chamber 100 shown in FIG. 1. The channel may be an exhaust channel through which, after reaction, ions remaining in the inner space of the chamber 100 are exhausted outside of the chamber 100.

An outer cover ring 520 is positioned on the outer ring 530, to cover the outer side of the inner cover ring 510. The outer circumference surface of the inner cover ring 510 and the top surface of the outer ring 530 may be secured against the inner side of the outer cover ring 520.

Plasma processing equipment having the above-described structure for preventing gap formation according to exemplary embodiments of the present invention will be described with respect to the operation and effects of the equipment.

In FIG. 2, a gas supply unit (not shown) supplies a predetermined amount of a plasma reaction gas GAS into the chamber 100. An external power supply unit (not shown) applies RF power across the upper electrode 110 and the lower electrode 120. The heater 130 embedded inside the electrostatic chuck 200 is heated to a predetermined temperature when the power (not shown) is applied thereto from the outside. Therefore, a plasma environment is formed inside the chamber 100, and the inside of the chamber is heated to a predetermined temperature by the heater 130.

Reaction ions formed inside the chamber 100 etch the layer material formed on the wafer W. The focus ring 300 positioned at the outer side of the electrostatic chuck 200 guides the reaction ions to move onto the top surface of the wafer W.

After the layer material formed on the wafer W is etched, polymers and other byproducts are generated inside the chamber 100. The polymers and byproducts flow towards the outer side of the outer cover ring 520, to be exhausted outside the chamber 100.

As illustrated in FIG. 3, the focus ring 300 according to an exemplary embodiment of the present invention comprises the first and second extension parts 410 and 420 that respectively protrude from the inner circumference surface 301 and the bottom surface 302 of the focus ring 300, at the predetermined length. The first and second extension parts 410 and 420 are respectively secured against the first and second stepped surfaces 211 and 212 of the electrostatic chuck 200. Therefore, the reaction ions moved onto the wafer W do not flow into the first and second spaces S1 and S2.

More specifically, the first extension part 410 positioned at the upper position of the focus ring 300 and at the upper position of the electrostatic chuck 200 seals the first space S1 from the outside. Therefore, the reaction ions are prevented from flowing into the first space S1, and the polymers generated when an upper part of the focus ring 300 is partially etched by the reaction ions are prevented from flowing into and being deposited in the first space S1.

Because the first sealing member 351 is interposed in the first space S1, even though a slight amount of the reaction ions and polymers may flow into the first space S1, the flowing reaction ions and any generated polymers are prevented from flowing into the second space S2.

As illustrated in FIG. 5, the first sealing member 351' is fixedly fitted into the first groove 301a formed in the inner circumference surface 301 of the focus ring 300, thereby minimizing any position variation of a sealing point between the inner circumference surface 301 of the focus ring 300 and the first stepped surface 211 of the electrostatic chuck 200.

Because the second extension part 420 formed on the bottom surface 302 of the focus ring 300 is secured against the second stepped surface 212 of the electrostatic chuck 200, the second space S2 is sealed from the outside. Therefore, the reaction ions are prevented from flowing into the second space S2 through a contact space between the holder ring 500 and the third extension part 430.

Furthermore, because the second sealing member 352 is interposed in the second space S2, even though a slight amount of the reaction ions and polymers may flow into the second space S2, the flowing reaction ions and polymers are prevented from flowing into the first space S1.

As illustrated in FIG. 5, the second sealing member 352' is fixedly fitted into the second groove 302a formed in the bottom surface 302 of the focus ring 300, thereby minimizing any position variation of a sealing point between the bottom surface 302 of the focus ring 300 and the second stepped surface 212 of the electrostatic chuck 200.

As illustrated in FIG. 3, the third extension part 430 formed on the bottom surface 302 of the focus ring 300 is secured against the top surface of the holder ring 500. Further, the third sealing member 353, composed of a rubber or metal material, is interposed between the inside of the third extension part 430 and the top of the holder ring 500.

Therefore, because the space between bottom surface 302 of the focus ring 300 and the top of the holder ring 500 is sealed by the third extension part 430 and the third sealing member 353, the polymers and byproducts, which are generated inside the chamber 100 and are exhausted through the exhaust channel, are prevented from flowing into the second space S2.

As described above, the gap prevention unit 400 according to the present invention has three sealing points. That is, a first sealing point is the position at which the first sealing member 351 positioned in the first space S1 is disposed, a second sealing point is the position at which the second sealing member 352 positioned in the second space S2 is disposed, and a third sealing point is the position at which the third sealing member 353 interposed between the third extension part 430 and the top of the holder ring 500 is disposed.

In the above description, the first, second and third extension parts 410, 420 and 430 formed in the focus ring 300 are respectively secured against the first stepped surface 211 and the second stepped surface 212 of the electrostatic chuck 200 and the top surface of the holder ring 500, thereby having the operation of sealing the first and second spaces S1 and S2 from the outside and the operation of minimizing the position variation of the three sealing points, that is, at the positions where the first sealing member 351, the second sealing member 352, and the third sealing member 353 are disposed.

The first and second extension parts 410 and 420 of the gap prevention unit 400 according to exemplary embodiments of the present invention are formed in the focus ring 300 as illustrated in FIGS. 2 through 5 but they may, however, be formed in the electrostatic chuck 200. Specific exemplary embodiments thereof will be described with reference to FIGS. 6 through 8.

In FIG. 6, a first extension part 410', which protrudes from the first stepped surface 211 of the electrostatic chuck 200 at a predetermined length, can be secured against the inner circumference surface 301 of the focus ring 300 positioned at the stepped part 210. Therefore, the reaction ions and any polymers formed outside the focus ring 300 do not easily flow into the first space S1.

A second extension part 420', which protrudes from the second stepped surface 212 of the electrostatic chuck 200 at a predetermined length, can be secured against the bottom surface 302 of the focus ring 300 positioned at the stepped part 210. Therefore, the polymers exhausted through the exhaust channel do not easily flow into the second space S2.

In FIG. 7, the first extension part 410' formed in the electrostatic chuck 200 is fitted into a first connection groove 311a formed on the inner circumference surface 301 of the focus ring 300. The second extension part 420' of the electrostatic chuck 200 is fitted into a second connection groove 312a formed on the bottom surface 302 of the focus ring 300. Since the first and $2^{nd}$, extension parts 410' and 420' are respectively fitted into the first and second connection grooves 311a and 312a, the first and second spaces S1 and S2 are easily sealed from the outside.

Because the focus ring 300 is positioned at the outer side of the electrostatic chuck 200, the focus ring 300 does not easily move side to side or vertically, based on the top surfaces of the electrostatic chuck 200.

In FIG. 7, a first sealing member 351 is interposed between the first stepped surface 211 of the electrostatic chuck 200 and the inner circumference surface 301 of the focus ring 300. In FIG. 8, a first sealing member 351' is fitted into a first groove 201a formed on the first stepped surface 211 of the electrostatic chuck 200. Therefore, the reaction ions formed inside the chamber 100 are prevented from flowing into the first space S1 by the first extension part 410'. When a small amount of the reaction ions flows into the first space S1, however, the flowing reaction ions are prevented from flowing into the second space S2 by the first sealing member 351 in FIG. 7 and the first sealing member 351' in FIG. 8. Because the first sealing member 351' is fitted into the first groove 201a, the position of the first sealing member 351' is easily fixed.

Referring to FIG. 7, a second sealing member 352 is interposed between the second stepped surface 212 of the electrostatic chuck 200 and the bottom surface 302 of the focus ring 300. Further, as illustrated in FIG. 8, a second sealing member 352' is fitted into a second groove 202a formed on the second stepped surface 212 of the electrostatic chuck 200. Therefore, the polymers exhausted through the exhaust channel are prevented from flowing into the second space S2 by the second extension part 420'. When a small amount of the polymers flows into the second space S2, however, the flowing polymers are prevented from flowing into the first space S1 by the second sealing member 352 in FIG. 7 and the second sealing member 352' in FIG. 8. Because the second sealing member 352' is fitted into the second groove 202a, the position of the second sealing member 352' is easily fixed.

The polymers exhausted through the exhaust channel may be prevented from flowing into the second space S2 by the third extension part 430 that is extended from the bottom surface 302 of the focus ring 300 at a predetermined length and that is secured against the top surface of the holder ring 500. The polymers may be more easily prevented from flowing into the second space S2 by the third sealing member 353 that is positioned at the inner side of the third extension part 430 and is disposed on the top of the holder ring 500.

In an exemplary embodiment of the present invention, the third extension part 430 illustrated in FIGS. 3 and 6 may be a third extension part (not shown) formed from an upper part of the holder ring 500 that is extended at a predetermined length and that is secured against the bottom surface 302 of the focus ring 300. Therefore, because the third extension part (not shown) is secured against the bottom surface 302 of the focus ring 300, and the third sealing member 353 is interposed on the holder ring 500 to be positioned at the inner side of the third extension part (not shown), the polymers exhausted through the exhaust channel are prevented from flowing into the second space S2.

As described above, in accordance with exemplary embodiments of the present invention, the sealing member interposed between the electrostatic chuck and the focus ring is prevented from being burned.

Furthermore, because multiple sealing points are formed in the spaces between the electrostatic chuck and the focus ring, the reaction ions and any polymers formed inside the chamber are easily prevented from flowing into the spaces and, thus, being deposited in the spaces.

Because the extension parts formed in the electrostatic chuck or the focus ring are fixedly fitted into the connection grooves formed respectively in the electrostatic chuck or the focus ring, the focus ring is prevented from being distorted by the electrostatic chuck.

What is claimed is:

1. A structure for preventing gap formation in a plasma environment, comprising:
   a chuck; and
   a focus ring positioned at an outer side of the chuck, the focus ring having a gap prevention unit for isolating from the outside a space between the chuck and the focus ring, wherein:
      the space between the chuck and the focus ring includes a first space and a second space substantially perpendicular to the first space,
      first and second sealing members are respectively formed in the first and second spaces and only partially fill the first and second spaces, and
      the gap prevention unit includes first and second extension parts of the focus ring respectively sealing the first and second spaces from the outside,
   wherein the first and second extension parts are separate and spaced apart from the first and second sealing members.

2. The structure for preventing gap formation according to claim 1, wherein
   the chuck has a stepped part formed at an outside circumference of the chuck and including a first stepped surface and a second stepped surface;
   the focus ring is positioned at the stepped part; and
   the first space is formed between an inner circumference surface of the focus ring and the first stepped surface, and the second space is formed between a bottom surface of the focus ring and the second stepped surface.

3. The structure for preventing gap formation according to claim claim 2, wherein:
   the first extension part is extended from the focus ring, at a predetermined length, to be secured against the first stepped surface of the chuck and to seal the first space from the outside; and the second extension part is extended from the focus ring, at a predetermined length, to be secured against the second stepped surface of the chuck and to seal the second space from the outside.

4. The structure for preventing gap formation according to claim 3, wherein
the first stepped surface of the chuck has a first connection groove that is fitted with and connected to the first extension part; and
the second stepped surface of the chuck has a second connection groove that is fitted with and connected to the second extension part.

5. The structure for preventing gap formation according to claim 2, wherein:
the first sealing member is fitted into a first groove formed on the inner circumference surface of the focus ring; and
the second sealing member is fitted into a second groove formed on the bottom surface of the focus ring.

6. Plasma processing equipment having a structure for preventing gap formation, comprising:
a chamber inside which a plasma environment is formed;
an upper electrode positioned at a upper position of the chamber;
an electrostatic chuck positioned at a lower position of the chamber, having a lower electrode and holding a wafer on a top surface thereof; and
a focus ring positioned at an outer side of the electrostatic chuck, the focus ring having a gap prevention unit for isolating from the outside a space between the electrostatic chuck and the focus ring, wherein:
the space between the electrostatic chuck and the focus ring includes a first space and a second space substantially perpendicular to the first space,
first and second sealing members are respectively formed in the first and second spaces and only partially fill the first and second spaces, and
the gap prevention unit includes first and second extension parts of the focus ring respectively sealing the first and second spaces from the outside,
wherein the first and second extension parts are separate and spaced apart from the first and second sealing members.

7. The plasma processing equipment according to claim 6, wherein
the electrostatic chuck has a stepped part formed at an outside circumference of the electrostatic chuck and including a first stepped surface and a second stepped surface;
the focus ring is positioned at the stepped part; and
the first space is formed between an inner circumference surface of the focus ring and the first stepped surface, and the second space is formed between a bottom surface of the focus ring and the second stepped surface.

8. The plasma processing equipment according to claim 7, wherein the focus ring has an outer diameter greater than an outer diameter of the electrostatic chuck.

9. The plasma processing equipment according to claim 8, further comprising:
a holder ring positioned under the focus ring at the outer side of the electrostatic chuck.

10. The plasma processing equipment according to claim 9, wherein:
the first extension part is extended from the focus ring, at a predetermined length, to be secured against the first stepped surface of the electrostatic chuck and to seal the first space from the outside; and
the second extension part is extended from the focus ring, at a predetermined length, to be secured against the second stepped surface of the electrostatic chuck and to seal the second space from the outside.

11. The plasma processing equipment according to claim 10, wherein the gap prevention unit further comprises:
a third extension part that is extended from the bottom surface of the focus ring, at a predetermined length, to be secured against a top surface of the holder ring and to seal the second space from the outside.

12. The plasma processing equipment according to claim 10, wherein
the first stepped surface of the electrostatic chuck has a first connection groove that is fitted with and connected to the first extension part; and
the second stepped surface of the electrostatic chuck has a second connection groove that is fitted with and connected to the second extension part.

* * * * *